United States Patent
Lee et al.

(10) Patent No.: US 12,305,080 B2
(45) Date of Patent: May 20, 2025

(54) SLURRY COMPOSITION FOR POLISHING SILICON OXIDE FILM, AND POLISHING METHOD USING SAME

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Seong Hwan Kim, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 815 days.

(21) Appl. No.: 17/430,637

(22) PCT Filed: Mar. 2, 2020

(86) PCT No.: PCT/KR2020/002934
§ 371 (c)(1),
(2) Date: Aug. 12, 2021

(87) PCT Pub. No.: WO2020/180061
PCT Pub. Date: Sep. 10, 2020

(65) Prior Publication Data
US 2022/0145131 A1     May 12, 2022

(30) Foreign Application Priority Data

Mar. 4, 2019   (KR) .................. 10-2019-0024836

(51) Int. Cl.
C09G 1/02      (2006.01)
C09K 3/14      (2006.01)
H01L 21/304    (2006.01)
H01L 21/3105   (2006.01)

(52) U.S. Cl.
CPC .............. *C09G 1/02* (2013.01); *C09K 3/1454* (2013.01); *H01L 21/304* (2013.01); *C09K 3/1409* (2013.01); *C09K 3/1445* (2013.01); *C09K 3/1463* (2013.01); *H01L 21/31051* (2013.01); *H01L 21/31053* (2013.01)

(58) Field of Classification Search
CPC ...... C09G 1/02; C09K 3/1454; C09K 3/1409; C09K 3/1445; C09K 3/1463; C09K 3/1472; H01L 21/304; H01L 21/31051; H01L 21/31053; H01L 21/30625
See application file for complete search history.

(56) References Cited

U.S. PATENT DOCUMENTS

| | | | |
|---|---|---|---|
| 2015/0031205 A1* | 1/2015 | Mishima | C09G 1/02 438/693 |
| 2015/0344739 A1 | 12/2015 | Kamei et al. | |
| 2017/0002233 A1* | 1/2017 | Park | C01F 17/235 |
| 2017/0154787 A1 | 6/2017 | Sakashita et al. | |
| 2018/0215952 A1 | 8/2018 | Onishi et al. | |
| 2018/0230334 A1* | 8/2018 | Lee | C09K 3/1463 |

FOREIGN PATENT DOCUMENTS

| | | |
|---|---|---|
| CN | 108026434 A | 5/2018 |
| JP | 2013-074036 A | 4/2013 |
| JP | 2017014482 A | 1/2017 |
| JP | 2018535538 A | 11/2018 |
| KR | 10-2012-0067701 A | 6/2012 |
| KR | 10-1409889 B1 | 6/2014 |
| KR | 101628878 B1 * | 6/2016 |
| KR | 20160077645 A | 7/2016 |
| WO | 2009-032096 A1 | 3/2009 |
| WO | 2018020931 A1 | 2/2018 |
| WO | 2018159530 A1 | 9/2018 |
| WO | 2020117438 A1 | 6/2020 |

* cited by examiner

*Primary Examiner* — Anthony J Green
*Assistant Examiner* — Marites A Guino-O Uzzle
(74) *Attorney, Agent, or Firm* — NKL Law; Jae Youn Kim

(57) ABSTRACT

Proposed are a CMP slurry composition and a polishing method using the same. The CMP slurry composition in which the zeta potential of colloidal silica serving as an abrasive is properly controlled and metal impurities are removed from the colloidal silica and to a polishing method using the same. The CMP slurry composition is configured to improve a polishing performance for a silicon oxide film, minimize scratches on a finished surface, and to enable adjustment of a content ratio of an abrasive and an additive in the composition, thereby enabling adjustment of a polishing selectivity among a silicon oxide film, a silicon nitride film, and a polysilicon film.

6 Claims, No Drawings

SLURRY COMPOSITION FOR POLISHING SILICON OXIDE FILM, AND POLISHING METHOD USING SAME

TECHNICAL FIELD

The present invention relates to a CMP slurry composition and a polishing method using the same.

BACKGROUND ART

Recently, the height of patterns formed on a wafer has increased to achieve greater integration in semiconductor devices. High-aspect-ratio features on a wafer cause difficulties in precisely printing a mask pattern in the subsequent lithography process due to an increase in the depth of focus (DOF).

For this reason, a chemical mechanical polishing (CMP) process in which chemical and mechanical removal actions are combined has been widely used to planarize the top surface of a wafer having high-aspect-ratio features thereon. In a typical CMP process, a wafer having high-aspect-ratio features thereon is first brought into close contact with a polishing pad, and a slurry including an abrasive and a chemical is injected into a gap between the wafer and the polishing pad to form a flat surface through polishing. That is, a CMP process can be simply defined as an operation of removing a specific film on a semiconductor wafer to provide a leveled surface. In the CMP process, the uniformity in the surface roughness of a finished surface is a key factor. For the CMP process, a head on which a wafer is to be mounted, a pad rotating in the same direction as the head, and a slurry containing nano-sized abrasive particles are necessarily required. A wafer is fixedly mounted on the head by means of surface tension or vacuum pressure. A CMP process uses a slurry and a chemical liquid to produce a leveled surface through polishing. During a CMP process, a polishing table with a polishing pad attached thereto performs a simple rotational motion, a head performs rotational and oscillating motions simultaneously, and a constant pressure is applied to the wafer so that the wafer is pressed toward the polishing table. The wafer surface and the polishing pad come into contact with each other due to the weight of the head and the applied pressure, and the slurry, which is a processing liquid, is injected to be present in the voids of the polishing pad. During the CMP process, a polishing target material can be mechanically removed due to the friction between abrasive particles contained in the slurry and protrusions formed on the surface of the polishing pad and can be chemically removed due to a chemical reaction of a chemical component contained in the slurry. In addition, since contacts between the abrasive particles and the surface protrusions of the polishing pad are made in a region in which protruding features are present on a wafer, the force is concentrated on the area so that a film in the region is removed at a higher removal rate than other regions, and thus a leveled wafer surface can be obtained.

In general, in a low pH condition, a silicon nitride film has a positive zeta potential value whereas a silicon oxide film has a negative zeta potential value. To achieve a high polishing rate for a silicon oxide film according to the electrostatic attraction theory, an abrasive material having a positive zeta potential that is opposite to the zeta potential of the silicon oxide film is used to increase the adsorption force with respect to the silicon oxide film. In addition, colloidal silica serving as an abrasive inevitably contains metal impurities that are generated or externally introduced during the manufacturing process, and the impurities make defects such as scratches during a polishing process. A high-purity abrasive that contains no metal impurities significantly lowers a rate of scratches.

There are two different CMP processes in terms of determination of a polishing end point: polishing of a layer made of the same material is performed until a predetermined thickness of the layer is removed; and polishing of a double layer made of different materials is performed until an interface between the different materials is detected. When the polishing rate of the material of a lower layer not to be polished is significantly smaller than the polishing rate of the material of an upper layer being polished, the polishing end point (PEP) can be naturally determined with a slight over-polishing amount. The difference between the polishing rate of one material and the polishing rate of another material is called "selectivity". A CMP slurry is required to contain abrasive particles exhibiting a selectivity between different materials and chemicals that can cause a chemical reaction with a material to be polished. Specifically, a gate gap polysilicon processing process used to manufacture 3D NAND flash semiconductor devices requires a slurry containing abrasive particles having a selectivity between a silicon oxide film and a silicon nitride film while exhibiting a higher polishing rate for the silicon oxide film such that the polishing end point is reached as soon as the silicon nitride film is reached. In addition, there is a need for development of an optimal CMP slurry composition that causes less or no micro-scratches on a metal layer to improve the electrical properties of a semiconductor device.

On the other hand, a polishing target surface nowadays has a variety of films such as a polycrystalline silicon film, a monocrystalline silicon film, a silicon oxide film, and a silicon nitride film being exposed therefrom. Each of conventional CMP slurry compositions is prepared to aim at a single film. However, when a slurry composition has an excessively high selectivity between two materials, the target material to be polished may be overly polished, resulting in defects such as dishing and erosion on the surface of the remaining material. In addition, when polishing different films using conventional CMP slurry compositions, a suitable CMP slurry is selected and supplied for a specific film every time the polishing target film changes. This causes the problem of lowering the throughput of the CMP process.

On the other hand, in recent years, with the diversification of the structures of semiconductor devices, it is required to simultaneously polish three different films such as a polysilicon film, a silicon oxide film, and a silicon nitride film. In order to simultaneously polish these three different films, it is necessary to develop a CMP slurry composition that enables the on-site adjustment of a polishing selectivity of one film to the other two films rather than a method of switching among slurries suitable for respective polishing targets.

DISCLOSURE

Technical Problem

An objective of the present invention is to provide a CMP slurry composition capable of on-site adjustment of a polishing selectivity among a silicon oxide film, a silicon nitride film, and a polysilicon film so that the CMP slurry composition can be conveniently used in a process of selectively removing at least one of the silicon oxide film, the silicon nitride film, and the polysilicon film. In addition, other objectives of the present invention are to provide a polishing slurry and a method of planarizing an insulating film using the same, the polishing slurry being capable of using high-purity colloidal silica having a positive zeta potential value as an abrasive for leveling the surface of a silicon oxide film. The polishing slurry has the advantage of minimizing defects such as scratches when leveling a film.

Technical Solution

In order to achieve one of the objectives, there is provided a CMP slurry composition capable of improving a polishing performance for a silicon oxide film and of minimizing scratches of surface defects by enabling on-site adjustment of a polishing selectivity among a silicon oxide film, a silicon nitride film, and a polysilicon film, the CMP slurry composition including: an abrasive made of colloidal silica; at least one additive selected from the group consisting of polyethylene glycol and heterocyclic compounds; and a solvent.

In a preferred embodiment of the present invention, the colloidal silica may have a zeta potential value in a range of from +10 to +70 mV.

In a preferred embodiment of the present invention, the metal (for example, Li, B, Mg, K, Ca, Ti, V, Cr, Mn, Fe, Co, Ni, Cu, Zn, Zr, Mo, Ag, Cd, Sn, Ta, W, Pt, Na, and Al) may be present in a concentration of 100 ppb or less. A particle size may be in a range of from 10 to 120 nm.

In a preferred embodiment of the present invention, the heterocyclic compound has two or more nitrogen atoms and may be at least one selected from the group consisting of 1,2,4H-triazole, 5-methylbenzotriazole, tetrazole, imidazole, 1,2-dimethylimidazole, and piperazine.

In a preferred embodiment of the present invention, the at least one additive may include polyethylene glycol to control the selectivity of the polysilicon film to the other films and a heterocyclic compound to control the selectivity of the silicon nitride film to the other films.

In a preferred embodiment of the present invention, the CMP slurry composition may include 0.2% to 10% by weight of an abrasive made of colloidal silica, 0.001% to 7% by weight of at least one additive selected from the group consisting of polyethylene glycol and heterocyclic compounds, and the remainder being a solvent, relative to the total weight of the CMP slurry composition.

In a preferred embodiment of the present invention, the at least one additive may include polyethylene glycol and a heterocyclic compound that are contained in a ratio of 0 to 5.0:0 to 5.0.

In a preferred embodiment of the present invention, the CMP slurry composition may have a pH of 3 to 5.

In a preferred embodiment of the present invention, the CMP slurry composition may exhibit a polishing rate of 200 to 3000 Å/min for the silicon oxide film and may be used to simultaneously polish at least two different films selected from among the silicon oxide film, the silicon nitride film, and the polysilicon film.

In a preferred embodiment of the present invention, the CMP polishing composition may exhibit a polishing selectivity ratio of 1 to 50:1:1 to 10 for the silicon oxide film, the silicon nitride film, and the polysilicon film.

In a preferred embodiment of the present invention, the CMP slurry composition may be provided in the form a single slurry in which the additive and the abrasive are premixed.

In another aspect of the present invention, there is provided a polishing method using the CMP slurry composition, the method including: polishing a semiconductor wafer using the CMP slurry composition.

In a preferred embodiment of the present invention, in the polishing method, the abrasive and the additive are separately injected to adjust a ratio of the abrasive and the additive depending on a required polishing selectivity among a silicon oxide film, a silicon nitride film, and a polysilicon film.

In a preferred embodiment of the present invention, the content of the colloidal silica may be controlled to adjust the polishing rate of the silicon oxide film, and the content of the polyethylene glycol may be controlled to adjust the selectivity of the polysilicon film.

In addition, the polishing may be performed by adjusting the selectivity of the silicon nitride film with respect to the other films by controlling the content of the heterocyclic compound.

In a preferred embodiment of the present invention, the at least one additive may include polyethylene glycol and a heterocyclic compound that are present in a content ratio of 0 to 5.0:0 to 5.0.

Advantageous Effects

The CMO slurry composition according to the present invention exhibits an improved polishing performance for a silicon oxide film and minimizes scratches of surface defects, thereby improving the reliability and throughput of a polishing process. In addition, since the CMP slurry composition enables a silicon oxide film to be polished with a high polishing selectivity with respect to a silicon nitride film and a polysilicon film, the CMP slurry composition can be usefully applied to a semiconductor device manufacturing process requiring the selective removal of the silicon oxide film. In addition, since the CMP slurry composition as described above does not require switching among slurries to be supplied every when a target film to be polished changes, the manufacturing efficiency of semiconductor devices can be improved.

Best Mode

Hereinafter, the present invention will be described in detail.

Unless otherwise defined, all terms including technical and scientific terms used herein have the same meaning as commonly understood by those who are ordinarily skilled in the art to which this invention belongs. In general, the nomenclature used herein is that well known and commonly used in the art.

It will be further understood that the terms "comprises", "includes" or "has", when used in this specification, specify the presence of an element, but do not preclude the presence or addition of one or more other elements unless the context clearly indicates otherwise.

In general, when speaking of a slurry used in a chemical mechanical polishing (CMP) process, a composition including an abrasive and an additive is generally referred to as a slurry. Since the present invention is a technique of changing the flow rates of an abrasive and an additive to change a polishing selectivity according to the type of film to be polished, the terms "abrasive" and "additive" are used rather than the term "slurry". However, in some cases, a single slurry in which an additive and an abrasive are premixed may be used.

In the present invention, the term "removal rate" refers to a degree to which a film on a wafer is removed by a CMP process. That is, it means a film removal rate.

In the present invention, the term "selectivity ratio" refers to a ratio of removal rates of respectively different materials under the same polishing conditions.

Hereinafter, a CMP slurry composition according to the present invention and a polishing method using the same will be described in detail.

The zeta potential of colloidal silica included in a general CMP slurry composition has a negative value, and a silicon oxide film also has a negative surface potential value at a low pH. Therefore, there is a limit in removing a silicon oxide film having a high aspect ratio due to a low polishing rate attributable to an electrostatic repulsive force between the colloidal silica (i.e., abrasive) and the silicon oxide film. The zeta potential value of the colloidal silica is required to be in a range of +10 to +70 mV in terms of achieving a proper removal rate for a silicon oxide film, and more preferably it is required to be in a range of +30 to +50 mV. When the zeta potential value is less than +10 mV, the removal rate of the film decreases and thus the polishing process takes a long time. On the other hand, when it exceeds +70 mV, the removal rate is excessively high, and thus many scratches are generated. Therefore, the zeta potential values lower than +10 mV or higher than +70 mV are not desirable.

A typical colloidal silica contains metal impurities that are introduced during the manufacturing process thereof in a concentration of 10 to 600 ppm. The metal impurities may result in defects such as scratches on a finished surface. Preferably, in the colloidal silica, the total concentration of metal impurities including Li, B, Mg, K, Ca, Ti, V, Cr, Mn, Fe, Co, Ni, Cu, Zn, Zr, Mo, Ag, Cd, Sn, Ta, W, Pt, Na, Al, etc. is required to be 100 ppb or less to reduce scratches. It is more preferable that the total concentration of metal impurities is 50 ppb or less.

In general, a silicon nitride film can be polished at a relatively high removal rate at a relatively low pH. However, in the present invention, the CMP slurry composition is conditioned such that the selectivity of a silicon nitride film to a silicon oxide film or a polysilicon film is relatively low to minimize the removal rate of the silicon nitride film. According to the present invention, the selectivity of the silicon nitride film to the silicon oxide film or the polysilicon film is freely increased or decreased according to the structural characteristics of a device while the CMP process is performed.

A factor for controlling the selectivity of the silicon nitride film to the silicon oxide film or the polysilicon film is the content ratio of the additive and the abrasive. Thus, the content ratio of the additive and the abrasive is suitably adjusted according to a required CMP process condition so that a wafer can be polished with the optimum selectivity.

When existing slurries are used for the manufacture of semiconductor devices, there is the inconvenience of switching among the slurries during a CMP process every when a polishing target film changes. However, according to the present invention, there is no such in convenience. That is, only one slurry will be used for various kinds of semiconductor devices or for various semiconductor device manufacturing processes because the selectivity of one film to the others among a silicon oxide film, a silicon nitride film, and a polysilicon film can be controlled on site during a CMP process. Therefore, it is possible to continuously perform the CMP process even when a target film changes without requiring the interruption of the on-going CMP process.

An embodiment of the present invention provides a CMP slurry composition including an abrasive made of colloidal silica, at least one additive selected from the group consisting of polyethylene glycol and heterocyclic compounds, and a solvent such that a polishing selectivity among a silicon oxide film, a silicon nitride film, and a polysilicon film can be easily changed.

The colloidal silica refers to a colloidal solution in which silica particles having nanometer-order particle sizes are stably dispersed in a solvent without sedimentation. Preferably, the sizes of the silica particles range from 10 to 120 nm to reduce scratches and to obtain a satisfiable removal rate. More preferably, the sizes of the silica particles may range from 30 to 80 nm. When the particle size of the colloidal silica is smaller than 10 nm, the removal rate of a film is low and thus the polishing process takes a long time. On the other hand, when it exceeds 120 nm, the removal rate is excessively high so that the CMP process is vulnerable to scratches. Therefore, the particle sizes smaller than 10 nm or larger than 120 nm are not desirable in terms of reduction of scratches on a finished surface.

In the CMP slurry composition according to a preferred embodiment of the present invention, as the additive, polyethylene glycol is used to control a selectivity of a polysilicon film to the other films and a heterocyclic compound is used to control a selectivity of a silicon nitride film with respect to the other films. That is, when the content of the polyethylene glycol as the additive is increased, the polishing rate of the polysilicon film is significantly reduced due to the properties of a powdery emulsifier because the polyethylene glycol serves as a nonionic surfactant. On the other hand, when the content of the heterocyclic compound as the additive is increased, the polishing rate of the silicon nitride film is reduced but sedimentation and agglomeration of silica particles are inhibited.

A heterocyclic compound having two or more nitrogen atoms may be used. Examples of the heterocyclic compounds having two or more nitrogen atoms include 1,2,4H-triazole, 5-methylbenzotriazole, tetrazole, imidazole, 1,2-dimethylimidazole, and piperazine. At least one of the compounds may be used alone or in combination.

In the CMP slurry composition according to one embodiment of the present invention, the solvent is used to adjust the concentration of the slurry to control the removal rate for each film. The solvent may be diluted with an additive. Preferably, deionized water, water, etc. may be used as the solvent, but deionized water is preferably used.

Relative to the total weight of the CMP slurry composition, the colloidal silica serving as the abrasive accounts for 0.2% to 10% by weight, the at least one additive selected from the group consisting of polyethylene glycol and heterocyclic compounds accounts for 0.001% to 7% by weight, and the solvent accounts for the rest.

The abrasive made of the colloidal silica is preferably contained in a concentration of 0.2% to 10% by weight relative to the total weight of the CMP slurry composition. When the content of the colloidal silica is less than 0.2% by weight, the solid content is insufficient and the removal rate is reduced. On the contrary, the content exceeding 10% by weight is not preferable because agglomeration of silica particles may easily occur.

The at least one additive selected from the group consisting of polyethylene glycol and heterocyclic compounds is preferably included in an amount of 0.001% to 700 by weight relative to the total weight of the CMP slurry composition. When the content of an additive is less than 0.001% by weight, the additive cannot properly exhibit the function thereof. When the content of an additive exceeds 7% by weight, it is not preferable because the additive inhibits the other additives from properly functioning.

As for the additives, the content ratio of polyethylene glycol and heterocyclic compound is preferably in a range of 0 to 5.0:0 to 5.0. In this case, a polishing selectivity ratio of a silicon oxide film, a silicon nitride film, and a polysilicon film may fall in a satisfiable range of 1 to 50:1:1 to 10. That is, the selectivity of the silicon nitride film with respect to the silicon oxide film and the polysilicon film can be adjusted. That is, the removal rate of the silicon nitride film can be controlled relative to the removal rate of the silicon oxide film and the polysilicon film.

The CMP slurry composition according to one embodiment of the present invention preferably has a pH in a range of 3 to 5 in terms of stability of the composition. When the pH is lower than 3, the removal rate is unstable. When the pH is higher than 5, it is not preferable because the colloidal particles may aggregate, and the removal rate becomes unstable. In order to adjust to the pH of the CMP slurry composition to be within the range of 3 to 5, KOH, $NH_4OH$, NaOH, TMAH, TBAH, $HNO_3$, or the like may be used alone or in combination as bases, and inorganic acids such as nitric acid, sulfuric acid, hydrochloric acid, etc. may be used alone or in combination as acids. Since the pH of the composition is closely related to the polishing rates of the silicon oxide film, the silicon nitride film, and the polysilicon film, the pH must be precisely controlled.

As described above, the CMP slurry composition provided by the present invention can be used to simultaneously polish two or more different films selected from among a silicon oxide film, a silicon nitride film, and a polysilicon film through the control of a content ratio of an additive and an abrasive which is made of colloidal silica. The CMP polishing composition may provide a polishing selectivity ratio of 1 to 50:1:1 to 10 for a silicon oxide film, a silicon nitride film, and a polysilicon film. In addition, the slurry may exhibit a removal rate (polishing rate) of 200 to 3000 Å/min for a silicon oxide film, a removal rate (polishing rate) of 20 to 1000 Å/min for a polysilicon film, and a removal rate (polishing rate) of 20 to 200 Å/min for a silicon nitride film. When the slurry composition exhibits those removal rates, the slurry composition can be usefully applied to a semiconductor device manufacturing process in which the selective removal of a silicon oxide film and a polysilicon film is required in a state in which a silicon nitride film is exposed on a polishing target surface because the silicon oxide film and the polysilicon film can be polished with a high polishing selectivity with respect to the silicon nitride film.

The CMP slurry composition provided by the present invention can be used to polish a silicon oxide film, a silicon nitride film, and a polysilicon film through the adjustment of a polishing selectivity ratio among the silicon oxide film, the polysilicon film, and the silicon nitride film. In addition, the CMP slurry composition can be used to polish other films. For example, in the case where the CMP slurry composition of the present invention is used for formation of a trench structure, the CMP slurry composition may be usefully used to polish the bulk body of a wafer. In another example, in a pipe channel region, a sacrificial film is generally used. In the case of forming a structure using a CMP process in the pipe channel region, various slurries having different characteristics are used to minimize a variation in the trench shape, which arises due to dishing or over-polishing in the pipe channel region. In the process, the CMP slurry composition of the present invention can be suitably used because the selectivity control for different films can be performed on site.

The CMP slurry composition of the present invention can also be provided in the form of a single slurry in which an additive and an abrasive are premixed in a predetermined content ratio.

Another embodiment of the present invention provides a polishing method using the CMP slurry composition, the method including a step of polishing a semiconductor wafer using the CMP slurry composition. In the polishing method, an abrasive and an additive are separately injected so that a content ratio of the abrasive and the additive can be controlled on site to adjust a polishing selectivity ratio among a silicon oxide film, a silicon nitride film, and a polysilicon film on site.

An exemplary polishing method using the CMP slurry composition will be described below. First, the CMP slurry composition is supplied to a polishing pad on a polishing platen, is brought into contact with a surface to be polished, and the surface to be polished and the polishing pad are moved relative to each other to perform polishing. As a polishing apparatus, an existing polishing apparatus including a holder for holding a semiconductor substrate and a polishing platen to which a polishing pad is attached may be used. As the material of the polishing pad, nonwoven fabric, polyurethane foam, porous fluor resin, or the like may be used. During the polishing, the CMP slurry composition is continuously supplied to the polishing pad by a pump or the like through abrasive and additive supply lines. Although there is no specific limitation on the flow rates of the abrasive and the additive, it is preferable that the surface of the polishing pad is always covered with an abrasive material. In this case, the additives may be polyethylene glycol and a heterocyclic compound. The content of the polyethylene glycol is adjusted to control the selectivity of the polysilicon film, and the content of the heterocyclic compound is adjusted to control the selectivity of the silicon nitride film. In a preferred embodiment of the present invention, the content ratio of the polyethylene glycol to the heterocyclic compound is in a range of 0 to 5.0:0 to 5.0. After the polishing is finished, it is preferable to clean the semiconductor substrate with running water, then remove droplets on the surface of the semiconductor substrate, and finally dry the semiconductor substrate with a spin dryer or a lamp dryer. Examples of an object to be processed include a semiconductor substrate having a polishing target surface on which two or more different films from among a polysilicon film, a silicon nitride film, and a silicon oxide film are exposed.

The CMP slurry composition according to the present invention may be used to polish a silicon oxide film, a silicon nitride film, and a polysilicon film with a high polishing selectivity ratio. Therefore, the CMP slurry composition according to the present invention can be usually used in semiconductor device manufacturing processes in which a to-be-polished surface includes three different films including a polysilicon film, a silicon nitride film, and a silicon oxide film. In addition, since the CMP slurry composition of the present invention does not require switching among premixed slurries every when a target film to be polished changes, the production efficiency of semiconductor devices can be improved.

Herein after, preferable examples of the invention and comparative examples will be described. However, the examples described below are presented only for illustrative purposes and are not intended to limit the present invention.

MODE FOR CARRYING OUT THE INVENTION

Examples 1 to 6

Slurry compositions were prepared according to the components, content ratios, zeta potential values, and pH values listed in Table 1. First, colloidal silica was prepared as an abrasive. Deionized water as a solvent was mixed with an additive containing polyethylene glycol and 5methyl-benzotriazole to adjust the zeta potential value and the content of the abrasive. In this way, CMP slurry compositions that can improve a polishing performance for a silicon oxide film and can adjust a selectivity of the silicon oxide film with respect to a silicon nitride film were prepared. KOH or $HNO_3$ was added to the prepared CMP slurry compositions as a pH adjuster so that the pH of each CMP slurry composition was adjusted to 3.5.

Comparative Examples 1 and 2

Slurry compositions were prepared with the components, content ratios, zeta potential values, and pH values listed in Table 1. The slurry compositions of the comparative examples were prepared in the same manner as in Examples 1 to 6 except that the zeta potential value was adjusted to a negative value.

TABLE 1

| | Colloidal silica | | Additive (% by weight) | | |
| --- | --- | --- | --- | --- | --- |
| | Zeta potential value (mV) | (% by weight) | Polyethylene glycol | Heterocyclic compound (5methyl-benzotriazole) | pH |
| Example 1 | +15 | 3 | 0.5 | 0.025 | 3.5 |
| Example 2 | +30 | 3 | 0.5 | 0.025 | 3.5 |
| Example 3 | +50 | 3 | 0.5 | 0.025 | 3.5 |
| Example 4 | +15 | 6 | 0.5 | 0.025 | 3.5 |
| Example 5 | +30 | 6 | 0.5 | 0.025 | 3.5 |
| Example 6 | +50 | 6 | 0.5 | 0.025 | 3.5 |
| Comparative Example 1 | −20 | 3 | 0.5 | 0.025 | 3.5 |
| Comparative Example 2 | −35 | 3 | 0.5 | 0.025 | 3.5 |

Measurement of Characteristics (Evaluation of Polishing Rate for Each CMP Slurry Composition)

The polishing rates of a silicon oxide film and a silicon nitride film for each of the CMP slurry compositions prepared in Examples 1 to 6 and Comparative Examples 1 and 2 were evaluated.

For the evaluation, as a polishing apparatus, a CMP apparatus manufactured by CTS Co. was used.

The measurement results of the polishing rates of the silicon oxide film and the silicon nitride film when the prepared CMP slurry compositions are used are shown in Table 2 below.

TABLE 2

| | Removal Rate (Polishing Rate, Å/min) | | Selectivity of silicon |
| --- | --- | --- | --- |
| | Silicon oxide film | Silicon nitride film | oxide film to silicon nitride film |
| Example 1 | 400 | 38 | 10.5:1 |
| Example 2 | 550 | 35 | 15.7:1 |
| Example 3 | 630 | 26 | 24.2:1 |
| Example 4 | 650 | 40 | 16.3:1 |
| Example 5 | 890 | 39 | 22.8:1 |
| Example 6 | 1010 | 35 | 28.9:1 |
| Comparative Example 1 | 70 | 680 | 1:9.7 |
| Comparative Example 2 | 50 | 750 | 1:15 |

Comparing Examples 1 to 6 and Comparative Examples 1 and 2, as shown in Table 2, when the zeta potential of the colloidal silica serving as an abrasive had a positive value, it was confirmed that the polishing selectivity of the silicon oxide film to the silicon nitride film increased.

However, it was confirmed that the polishing selectivity of the silicon nitride film to the silicon oxide film was increased when the zeta potential had a negative value.

When comparing the results of Examples 1 to 3 corresponding to the cases where the zeta potential had a positive value and was increased from 15 to 30 to 50, the removal rate of the silicon nitride film decreased, and the removal rate of the silicon oxide film increased. Thus, it was confirmed that the selectivity increased. The same conclusions can be made from the comparison among the results of Examples 4 to 6 corresponding to the cases where the zeta potential value has a positive value and was increased from 15 to 30 to 50, the removal rate of the silicon nitride film decreased, and the removal rate of the silicon oxide film increased. That is, the selectivity between the silicon nitride film and the silicon oxide film increased.

On the other hand, when comparing the results of Examples 1 and 4 in which the content of the abrasive was increased from 3 to 6 with the zeta potential value fixed, it was confirmed that the removal rate of the silicon oxide film increased and thus the selectivity of the silicon oxide film increased. The same conclusion could be made through comparison between the results of Examples 2 and 5 and comparison between the results of Examples 3 and 6 in which the content of the abrasive was also increased from 3 to 6. That is, the removal rate of the silicon oxide film increased and thus the selectivity of the silicon oxide film to the silicon nitride film increased, with an increase of the content of the abrasive from 3 to 6.

In conclusion, with the use of the composition of the present invention in which the positive value of the zeta potential of the colloidal silica is increased or the content of the abrasive is increased, it is possible to increase the polishing rate of the silicon oxide film at an initial stage of the process so that the silicon oxide film initially having a high aspect ratio can be rapidly polished.

In addition, since the silicon oxide film can be polished with a high polishing selectivity with respect to the silicon nitride film, the CMP slurry composition of the present invention can be usefully applied to a semiconductor manufacturing process (for example, a gate gap polysilicon processing process) that requires selective removal of a silicon oxide film.

Example 7

A high-purity colloidal silica from which metal impurities were removed was prepared, and a CMP slurry composition was prepared in the same manner as in Example 2.

Comparative Example 3

A CMP slurry composition was prepared in the same manner as in Example 7 except that general colloidal silica from which metal impurities were not removed was used.

The contents of metal impurities, the contents of components constituting a CMP slurry component, composition ratios of the components, and zeta potential values were set as shown in Table 3 below.

TABLE 3

| | Zeta potential value of colloidal silica: +30 mV | | | Additive (% by weight) | | |
|---|---|---|---|---|---|---|
| | Fe | Al | (% by weight) | Polyethylene glycol | Heterocyclic compound (5methyl-benzotriazole) | Number of scratches (ea) |
| Example 7 | 30 ppb | 80 ppb | 3 | 0.5 | 0.025 | 5 |
| Comparative Example 3 | 11 ppm | 520 ppm | 3 | 0.5 | 0.025 | 17 |

Measurement of Characteristics (Evaluation of Polishing Rate for Each CMP Slurry Composition)

Table 3 shows the number of scratches counted using AIT-XP after a silicon oxide film was polished using each of the CMP slurry compositions prepared as in Example 7 and Comparative Example 3.

When the silicon oxide film was polished with the slurry composition of Example 7, the number of scratches was significantly reduced compared to the case where the silicon oxide film was polished with the slurry composition of Comparative Example 3.

As a result, the composition of the present invention using the colloidal silica from which metal impurities are removed minimizes scratch defects of the silicon oxide film, thereby improving process reliability and productivity.

Examples 8 to 12

Slurry compositions were prepared according to the components, content ratios, zeta potential values, and pH values listed in Table 4. First, colloidal silica was prepared as an abrasive. Deionized water as a solvent was mixed with an additive containing polyethylene glycol and 5methyl-benzotriazole to adjust the zeta potential value and the content of the abrasive. In this way, CMP slurry compositions that can improve a polishing performance for a silicon oxide film and can adjust a selectivity of the silicon oxide film with respect to a silicon nitride film were prepared. KOH or HNO₃ was added to the prepared CMP slurry compositions as a pH adjuster so that the pH of each CMP slurry composition was adjusted to 3.5.

Comparative Examples 4 to 5

The slurry compositions of Comparative Examples 4 and 5 were prepared in the same manner as in Examples 8 to 12 except that the slurry composition of Comparative Example 4 did not use polyethylene glycol and the slurry composition of Comparative Example 5 did not use 5methyl-benzotriazole which is a heterocyclic compound. In each of the CMP slurry compositions, the type of colloidal silica and the content of the colloidal silica were the same.

The content of the colloidal silica contained in the prepared CMP slurry compositions is shown in Table 4 below.

TABLE 4

| | Colloidal silica | | Additive (% by weight) | | |
|---|---|---|---|---|---|
| | Zeta potential value (mV) | (% by weight) | Polyethylene glycol | Heterocyclic compound (5methyl-benzotriazole) | pH |
| Example 8 | +30 | 3 | 0.5 | 0.025 | 3.5 |
| Example 9 | +30 | 3 | 0.2 | 0.025 | 3.5 |

TABLE 4-continued

| | Colloidal silica | | Additive (% by weight) | | |
|---|---|---|---|---|---|
| | Zeta potential value (mV) | (% by weight) | Polyethylene glycol | Heterocyclic compound (5methyl-benzotriazole) | pH |
| Example 10 | +30 | 3 | 1.4 | 0.025 | 3.5 |
| Example 11 | +30 | 3 | 0.5 | 0.01 | 3.5 |
| Example 12 | +30 | 3 | 0.5 | 0.05 | 3.5 |
| Comparative Example 4 | +30 | 3 | 0 | 0.025 | 3.5 |
| Comparative Example 5 | +30 | 3 | 0.5 | 0 | 3.5 |

Measurement of Characteristics (Evaluation of Polishing Rate for Each CMP Slurry Composition)

The polishing rates of a silicon oxide film, a silicon nitride film, and a polysilicon film for each of the CMP slurry compositions prepared in Examples 8 to 12 and Comparative Examples 4 and 5 were evaluated.

For the evaluation, as a polishing apparatus, a CMP apparatus manufactured by CTS Co. was used.

The measurement results of the polishing rates of the silicon oxide film, the silicon nitride film, and the polysilicon film when the prepared CMP slurry compositions were used are shown in Table 5 below.

TABLE 5

| | Removal Rate (=Polishing Rate, Å/min) | | | Selectivity ratio |
|---|---|---|---|---|
| | Silicon oxide film | Silicon nitride film | Polysilicon film | (silicon oxide film:silicon nitride film:polysilicon film) |
| Example 8 | 550 | 35 | 100 | 10.5:1:2.9 |
| Example 9 | 570 | 42 | 450 | 13.6:1:10.7 |
| Example 10 | 580 | 38 | 50 | 15.3:1:1.3 |
| Example 11 | 560 | 55 | 95 | 10.2:1:1.7 |
| Example 12 | 550 | 20 | 105 | 27.5:1:5.3 |

TABLE 5-continued

| | Removal Rate (=Polishing Rate, Å/min) | | | Selectivity ratio |
|---|---|---|---|---|
| | Silicon oxide film | Silicon nitride film | Polysilicon film | (silicon oxide film:silicon nitride film:polysilicon film) |
| Comparative Example 4 | 540 | 30 | 575 | 18:1:19.2 |
| Comparative Example 5 | 545 | 94 | 90 | 5.8:1:0.96 |

Comparing Examples 8 to 12 with Comparative Examples 4 and 5, as shown in Table 5 above, it was confirmed that when the CMP slurry compositions of Examples 8 to 12 were used, the polishing selectivity of each of the silicon oxide film and the polysilicon film to the silicon nitride film increased. Specifically, the polishing selectivity of the silicon oxide film to the silicon nitride film was significantly increased to 1:10 or more.

In contrast, in the case of Comparative Example 4 in which polyethylene glycol for controlling the removal rate of the polysilicon film was not used, since the removal rate of the polysilicon film was higher than that of the silicon oxide film, there was a problem in that residues of the polysilicon film remained after the CMP process.

In the case where 5methyl-benzotriazole, which is a heterocyclic compound, is not used as in Comparative Example 5, the removal rate of the silicon nitride film increased, and thus the selectivity of the silicon oxide film and the polysilicon film with respect to the silicon nitride film decreased.

As described above, when the CMP slurry composition of the present invention was used, it was confirmed that the silicon oxide film and the polysilicon film could be polished with a high polishing selectivity with respect to the silicon nitride film. Therefore, the CMP slurry composition of the present invention can be usually applied to a semiconductor device manufacturing process that requires selective removal of a silicon oxide film and a polysilicon film.

The invention claimed is:

1. A CMP slurry composition configured to adjust a polishing selectivity of a silicon oxide film or a polysilicon film with respect to a silicon nitride film, the CMP slurry composition comprising:

0.2% to 10% by weight of an abrasive composed of colloidal silica;

0.001% to 7% by weight of an additive; and a solvent, wherein the colloidal silica has a zeta potential of +15 to +50 mV, the colloidal silica has a particle size of 30 to 80 nm, the additive comprises polyethylene glycol and 5-methylbenzotriazole that are present in a content ratio of 0.2 to 1.4:0.025 to 0.05, a polishing selectivity ratio of the silicon oxide film: the silicon nitride film: the polysilicon film is in a range of 10.2 to 27.5:1:1.3 to 10.7, and a removal rate of the silicon oxide film is within a range of 200 to 3000 Å/min.

2. The CMP slurry composition of claim 1, wherein the colloidal silica contains at least one metal selected from the group consisting of Li, B, Mg, K, Ca, Ti, V, Cr, Mn, Fe, Co, Ni, Cu, Zn, Zr, Mo, Ag, Cd, Sn, Ta, W, Pt, Na, and Al, in concentration of 100 ppb or less.

3. The CMP slurry composition of claim 1, wherein the colloidal silica contains at least one metal selected from the group consisting of Li, B, Mg, K, Ca, Ti, V, Cr, Mn, Fe, Co, Ni, Cu, Zn, Zr, Mo, Ag, Cd, Sn, Ta, W, Pt, Na, and Al, in concentration of 50 ppb or less.

4. The CMP slurry composition of claim 1, wherein the CMP slurry composition has a pH of 3 to 5.

5. A polishing method using the CMP slurry composition of claim 1 in a method of manufacturing a 3D NAND flash semiconductor device, the polishing method being used to remove an initial step height of the silicon oxide film during a gate gap polysilicon processing process, the polishing method comprising: simultaneously polishing the silicon nitride film and at least one film selected between the silicon oxide film and the polysilicon film.

6. The polishing method of claim 5, wherein the simultaneously polishing is performed by adjusting the polishing selectivity ratio of the silicon oxide film: the silicon nitride film: the polysilicon film by adjusting a content ratio of the abrasive and the additive.

* * * * *